(12) United States Patent
Choi et al.

(10) Patent No.: US 6,673,513 B2
(45) Date of Patent: Jan. 6, 2004

(54) PHOTOSENSITIVE POLYMER INCLUDING COPOLYMER OF ALKYL VINYL ETHER AND RESIST COMPOSITION CONTAINING THE SAME

(75) Inventors: Sang-jun Choi, Seoul (KR); Hyun-woo Kim, Seongnam (KR)

(73) Assignee: Samsung Electronics Co., Ltd., Suwon (KR)

( * ) Notice: Subject to any disclaimer, the term of this patent is extended or adjusted under 35 U.S.C. 154(b) by 168 days.

(21) Appl. No.: 09/764,150

(22) Filed: Jan. 19, 2001

(65) Prior Publication Data
US 2001/0024763 A1 Sep. 27, 2001

Related U.S. Application Data

(63) Continuation-in-part of application No. 09/576,053, filed on May 23, 2000, now Pat. No. 6,517,990.
(60) Provisional application No. 60/198,761, filed on Apr. 21, 2000.

(30) Foreign Application Priority Data

Jan. 19, 2000 (KR) ............................................ 2000-2489
Apr. 19, 2000 (KR) .......................................... 2000-20603

(51) Int. Cl.⁷ ..................... G03F 7/004; C08F 34/02; C08F 216/12
(52) U.S. Cl. .................... 430/270.1; 526/271; 526/281; 526/319; 526/332
(58) Field of Search ................... 430/270.1; 526/281, 526/271, 319, 332

(56) References Cited

U.S. PATENT DOCUMENTS

| | | | | |
|---|---|---|---|---|
| 3,557,067 A | * | 1/1971 | Burns et al. | 260/78.5 |
| 3,844,787 A | * | 10/1974 | Ulrich et al. | 96/35.1 |
| 3,887,369 A | | 6/1975 | Matsuno et al. | |
| 4,370,454 A | * | 1/1983 | Messmer et al. | 526/88 |
| 4,617,085 A | * | 10/1986 | Cole, Jr. et al. | 156/643 |
| 4,914,167 A | * | 4/1990 | Hambrecht et al. | 526/65 |
| 5,008,355 A | * | 4/1991 | Tazi et al. | 526/271 |
| 5,541,031 A | | 7/1996 | Yamashita et al. | |
| 6,033,442 A | | 3/2000 | Denzinger et al. | |
| 6,090,518 A | | 7/2000 | Niinomi et al. | |
| 6,306,554 B1 | | 10/2001 | Barclay et al. | |

FOREIGN PATENT DOCUMENTS

| | | |
|---|---|---|
| EP | 0836 119 A | 4/1999 |
| EP | 0 921 439 A | 6/1999 |
| GB | 1 408 327 A | 10/1975 |
| JP | 2000-72982 * | 3/2000 |
| WO | WO 98 58988 A | 12/1998 |

OTHER PUBLICATIONS

Chemical Abstracts, vol. 76, No. 16, Apr. 17, 1972 Columbus, Ohio, US; abstract No. 86402, A.R.M. Gibb: "Copolymers of alpha,beta–unsaturated carboxylic acid anhydrides" XP002166123 *abstract* & ZA 6 804 466 A Jan. 12, 1970.
Japanese website English translation of JP 2000–72982, Mar. 2000, www.ipdl.jpo.go.jp/homepg_e.ipdl.*
Chemical Abstracts, vol. 118, No. 19, May 10, 1993, Columbus, Ohio, US; abstract No. 182870, M.J. Han et al.: "Synthesis, characterization, and biological activity of polyanion–cis–diammineplatinum (II) complexes as antitumor agents" XP002166124 *abstract* J. Bioact. Compat. Polym., vol. 7, No. 4, 1992, pp. 358–369.
Chemical Abstracts, vol. 73, No. 10, Sep. 7, 1970 Columbus, Ohio, US; abstract No. 46154, B. Kamo et al.: "Copolymerization of 2,3–dihydrofuran" XP002166125 *abstract* & Kogyo Kagaku Zasshi, vol. 73, No. 3, –1970 pp. 580–586.
CA abstract 115:105550, Han et al., J. Bioact. Compat. Polym. 1990, 5(4), 420–9.

* cited by examiner

Primary Examiner—Rosemary Ashton
(74) Attorney, Agent, or Firm—Volentine Francos, PLLC

(57) ABSTRACT

There are provided a photosensitive polymer having a copolymer of alkyl vinyl ether and a resist composition containing the same. The photosensitive polymer includes a copolymer of alkyl vinyl ether and maleic anhydride, represented by the following structure:

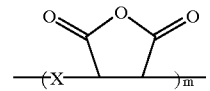

wherein X is one of a linear alkyl vinyl ether and a cyclic alkyl vinyl ether, which are respectively represented by the structures

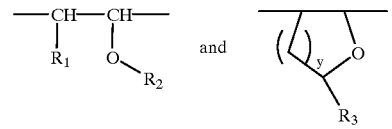

wherein y is one of the integer values 1 through 4, $R_1$ is one of a hydrogen atom and a methyl group, $R_2$ is a $C_1$ to $C_{20}$ hydrocarbon, and $R_3$ is one of a hydrogen atom, a $C_1$ to $C_3$ alkyl group and an alkoxy group.

40 Claims, 2 Drawing Sheets

PHOTOSENSITIVE POLYMER INCLUDING COPOLYMER OF ALKYL VINYL ETHER AND RESIST COMPOSITION CONTAINING THE SAME

CROSS-REFERENCE TO RELATED APPLICATIONS

This is a continuation-in-part (CIP) of U.S. non-provisional application No. 09/576,053, filed May 23, 2000 now U.S. Pat. No. 6,517,990; and this is a counterpart of and claims priority to U.S. provisional application No. 60/198,761, filed Apr. 21, 2000; Korean patent application no. 00-2489, filed Jan. 19, 2000; and Korean patent application no. 00-20603, filed Apr. 19, 2000; the contents of each of which are incorporated herein by reference for all purposes.

BACKGROUND OF THE INVENTION

1. Field of the Invention

The present invention relates to a photosensitive polymer and to a chemically amplified photoresist composition containing the same, and more particularly, the present invention relates to a photosensitive polymer which includes a copolymer of alkyl vinyl ether and to a resist composition containing the same.

2. Description of the Related Art

As semiconductor devices become highly integrated, photolithography processes used in the manufacture of such devices must be capable of forming fine patterns. For example, sub-quarter micron or smaller sized patterns are needed for semiconductor memory devices having capacities exceeding 1 Gbit. Accordingly, conventional resist materials have limited applicability since they are utilized in conjunction with krypton flouride (KrF) excimer lasers having wavelengths (248 nm) which are too large for use in the formation of ultra-fine patterns. Thus, new resist materials have been proposed for use in conjunction with an argon flouride (ArF) excimer laser. This is because the ArF excimer laser has a wavelength (193 nm) which is smaller than that of the KrF excimer laser.

Present resist materials designed for use with ArF excimer lasers suffer several drawbacks as compared with conventional resist materials. The most common of these problems are low transmittance and poor resistance to dry etching. (Meth)acrylate polymers are generally used and widely known as ArF resist materials. The most typical of these resist materials is the poly(methyl methacrylate-tert-butyl methacrylate-methacrylic acid) terpolymer system manufactured by IBM, Inc. However, such polymers exhibit a weak resistance to dry etching.

To obtain an increased resistance to dry etching, a polymer having a backbone composed of an alicyclic compound such as an isobornyl group, an adamantyl group or a tricyclodecanyl group, is used. However, the resulting resist still exhibits an unacceptably weak resistance to dry etching since only a small portion thereof is occupied by alicylic groups.

Also, since the alicyclic compound is hydrophobic, in the case where the alicyclic compound is contained in the terpolymer, a degree of adhesiveness to underlying layers is deteriorated.

In an attempt to solve this problem, the following tetrapolymer has been proposed in which a carboxylic acid group is introduced to the backbone of the polymer (see *J. Photopolym. Sci. Technol.*, 7(3), 507 (1994).):

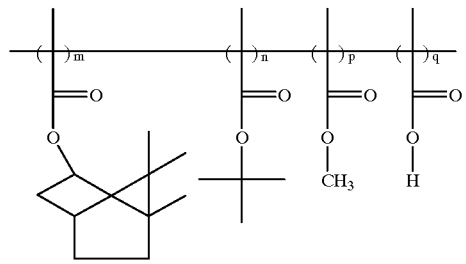

However, the resist layer obtained from the polymer having the above structure still exhibits a relatively poor adhesion to underlying layers, as well as a relatively poor resistance to dry etching. Also, the developing solution that is commonly employed during the development process must be diluted before being used.

Alternatively, a methacrylate copolymer having an alicyclic protecting group represented by the following formula has been proposed (see *J. Photopolym. Sci. Technol.*, 9(3), 509 (1996).):

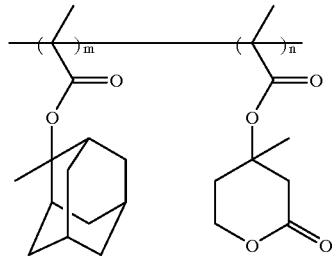

An adamantyl group for increasing the resistance to dry etching and a lactone group for improving the adhesion characteristic have been introduced to the backbone of the methacrylate copolymer having the above structure. As a result, the resist layer obtained from the polymer having the this structure does exhibit an improved resolution and depth of focus, but the resistance to dry etching is still relatively poor. Also, severe line edge roughness is observed when a line pattern is formed from the resist layer.

Also, the manufacturing cost associated with raw materials used to prepare the copolymer is very high. In particular, the cost of a monomer having a lactone group introduced thereto (to improve an adhesion characteristics) is so prohibitive as to make it difficult to commercially use the monomer.

Another conventional polymer is a cycloolefin-maleic anhydride (COMA) alternating polymer represented by the following formula (see *J. Photopolym. Sci. Technol.*, 12(4), 553 (1999) and U.S. Pat. No. 5,843,624.):

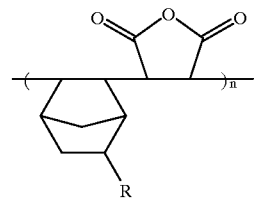

While the fabrication cost associated with raw materials needed to prepare a copolymer such as the COMA system is low, the yield of the polymer is noticeably reduced. Also, the transmittance of the polymer at short wavelengths, for example, 193 nm, is very low. Further, since such polymers have an alicyclic group in their backbone which is strongly hydrophobic, they have poor adhesion characteristics.

Also, due to the structural characteristics of the backbone, these polymers have a high glass transition temperature of about 200° C. or higher. As a result, it is difficult to carry out an annealing process to remove a free volume present in a resist layer obtained from such polymers. Thus, the resist layer is susceptible to an ambient environment. For example, the resist pattern may suffer a T-top profile. Also, in post-exposure delay (PED), the resist layer exhibits a decrease in stability to an ambient atmosphere, which entails many problems in a variety of processes using the resist layer.

SUMMARY OF THE INVENTION

It is an object of the present invention to provide a photosensitive polymer which has a high resistance to etching and improved adhesion to a substrate, while at the same time be capable of fabrication at a relatively low cost.

It is another object of the present invention to provide a resist composition which exhibits good lithographic characteristics during lithographic processes of both short wavelength radiation of 193 nm and deep UV radiation of 248 nm.

Accordingly, to achieve the above and other objects of the present invention, there is provided a photosensitive polymer comprising a copolymer of alkyl vinyl ether and maleic anhydride, represented by the following structure:

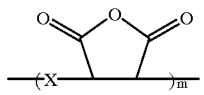

wherein X is one of a linear alkyl vinyl ether and a cyclic alkyl vinyl ether, which are respectively represented by the structures

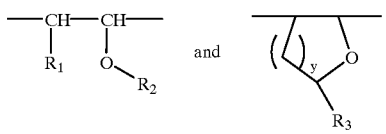

wherein y is one of the integer values 1 through 4, $R_1$ is one of a hydrogen atom and a methyl group, $R_2$ is a $C_1$ to $C_{20}$ hydrocarbon, and $R_3$ is one of a hydrogen atom, a $C_1$ to $C_3$ alkyl group and an alkoxy group.

Preferably, $R_2$ is methyl, ethyl, 2-hydroxy ethyl, n-butyl or iso-butyl group, and $R_3$ is methoxy or ethoxy group.

The weight average molecular weight of the polymer is preferably in the range of 3,000 to 100,000.

According to another aspect of the present invention, there is provided a photosensitive terpolymer comprising:
(a) a copolymer of alkyl vinyl ether and maleic anhydride, represented by the following structure:

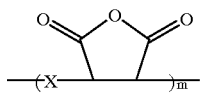

wherein X is one of a linear alkyl vinyl ether and a cyclic alkyl vinyl ether, which are respectively represented by the structures

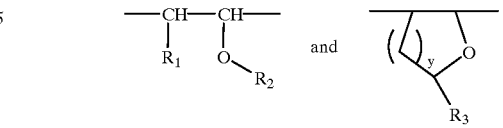

wherein y is one of the integer values 1 through 4, $R_1$ is one of a hydrogen atom and a methyl group, $R_2$ is a $C_1$ to $C_{20}$ hydrocarbon, and $R_3$ is one of a hydrogen atom, a $C_1$ to $C_3$ alkyl group and an alkoxy group; and
(b) a comonomer having an acid-labile substituent or a polar functional group.

Preferably, the comonomer includes an acrylate derivative, a methacrylate derivative, a fumarate derivative, a styrene derivative or norbornene derivative.

The comonomer may have an alicyclic hydrocarbon group as the substituent.

Specifically, the comonomer is preferably an acrylate or methacrylate derivative and the photosensitive terpolymer is represented by the following formula and has a weight average molecular weight of the polymer in the range of 3,000 to 100,000:

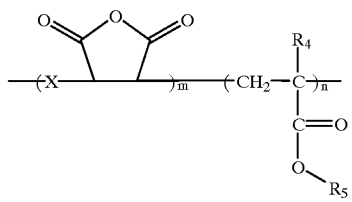

wherein $R_4$ is one of a hydrogen atom and a methyl group, $R_5$ is an acid-labile $C_2$ to $C_{20}$ hydrocarbon group, and n/(m+n)=0.1 to 0.7.

Preferably, $R_5$ is a t-butyl group or an acid-labile alicyclic hydrocarbon group. Examples of $R_5$ include 2-methyl-2-norbornyl, 2-ethyl-2-norbornyl, 2-methyl-2-isobornyl, 2-ethyl-2-isobornyl, 8-methyl-8-tricyclo[5.2.1.0$^{2.6}$]decanyl, 8-ethyl-8-tricyclo[5.2.1.0$^{2.6}$]decanyl, 2-methyl-2-adamantyl, 2-ethyl-2-adamantyl, 2-methyl-2-fenchyl or 2-ethyl-2-fenchyl group.

Particularly, the comonomer is preferably a norbornene derivative and the photosensitive terpolymer is represented by the following formula and has a weight average molecular weight of the polymer in the range of 3,000 to 100,000:

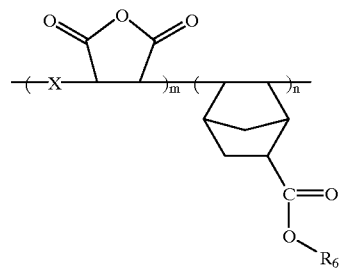

wherein $R_6$ is one of a hydrogen atom and an acid-labile $C_2$ to $C_{20}$ hydrocarbon group, and n/(m+n)=0.1 to 0.7.

According to another aspect of the present invention, there is provided photosensitive polymer comprising:
(a) a copolymer of alkyl vinyl ether and maleic anhydride, represented by the following structure:

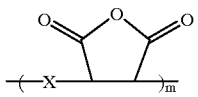

wherein X is one of a linear alkyl vinyl ether and a cyclic alkyl vinyl ether, which are respectively represented by the structures

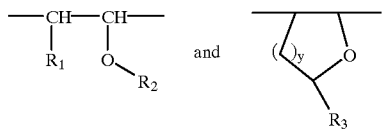

wherein y is one of the integer values 1 through 4, $R_1$ is one of a hydrogen atom and a methyl group, $R_2$ is a $C_1$ to $C_{20}$ hydrocarbon, and $R_3$ is one of a hydrogen atom, a $C_1$ to $C_3$ alkyl group and an alkoxy group; and (b) at least two comonomers consisting of acrylate, methacrylate or norbornene derivatives having an acid-labile substituent or a polar functional group.

According to still another aspect of the present invention, there is provided photosensitive polymer represented by the following structure:

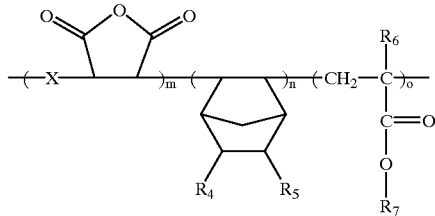

wherein X is one of a linear alkyl vinyl ether and a cyclic alkyl vinyl ether, which are represented by the structures

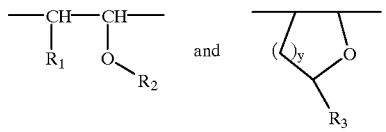

wherein y is one of the integer values 1 through 4, $R_1$ is one of a hydrogen atom and a methyl group, $R_2$ is a $C_1$ to $C_{20}$ hydrocarbon, and $R_3$ is one of a hydrogen atom, a $C_1$ to $C_3$ alkyl group and an alkoxy group; and wherein $R_4$ and $R_5$ independently are one of a hydrogen atom and a $C_1$ to $C_{25}$ aliphatic hydrocarbon, $R_6$ is one of a hydrogen atom and a methyl group, $R_7$ is an acid-labile $C_2$ to $C_{20}$ hydrocarbon group, $n/(m+n+o)=0.1$ to $0.7$, and $o/(m+n+o)=0.1$ to $0.7$.

To achieve another object of the present invention, there is provided a resist composition comprising:

(a) a photosensitive polymer comprising a copolymer of alkyl vinyl ether and maleic anhydride, represented by the following structure:

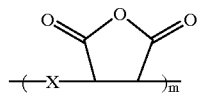

wherein X is one of a linear alkyl vinyl ether and a cyclic alkyl vinyl ether, which are respectively represented by the structures

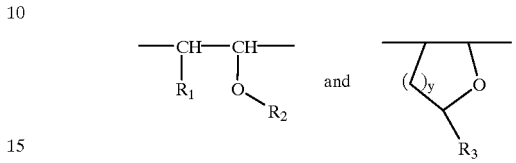

wherein y is one of the integer values 1 through 4, $R_1$ is one of a hydrogen atom and a methyl group, $R_2$ is a $C_1$ to $C_{20}$ hydrocarbon, and $R_3$ is one of a hydrogen atom, a $C_1$ to $C_3$ alkyl group and an alkoxy group; and (b) a photoacid generator (PAG).

Preferably, the PAG is contained in an amount of 0.5 to 20% by weight based on the weight of the photosensitive polymer.

Examples of the PAG include triarylsulfonium salts, diaryliodonium salts, sulfonates or mixtures thereof, and others.

The resist composition according to the present invention may further include an organic base.

The organic base is preferably contained in an amount of 0.5 to 50 mol % based on the concentration of the PAG.

Preferably, the organic base is a compound comprising tertiary amine alone or in a mixture of at least two kinds thereof.

According to another aspect of the present invention, there is provided a resist composition comprising:

(a) a photosensitive polymer; and
(b) a photoacid generator (PAG), the photosensitive polymer comprising (a-1) a copolymer of alkyl vinyl ether and maleic anhydride and (a-2) a comonomer having an acid-labile substituent or a polar functional group, the copolymer being represented by the following structure:

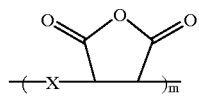

wherein X is one of a linear alkyl vinyl ether and a cyclic alkyl vinyl ether, which are respectively represented by the structures

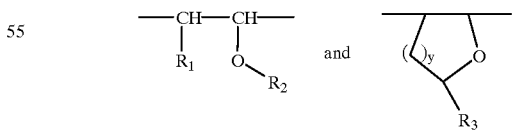

wherein y is one of the integer values 1 through 4, $R_1$ is a hydrogen atom or a methyl group, $R_2$ is a $C_1$ to $C_{20}$ hydrocarbon, and $R_3$ is one of a hydrogen atom, a $C_1$ to $C_3$ alkyl group and an alkoxy group.

According to the present invention, a resist composition can be obtained which includes a copolymer of alkyl vinyl ether monomer and maleic anhydride, which entail very low fabrication costs, and which has excellent adhesion to underlying film materials and excellent resistance to dry etching. Also, since the photosensitive polymer according to the present invention has an appropriate glass transition temperature, an excellent lithographic performance can be achieved by employing the resist composition obtained therefrom in a photolithographic process.

BRIEF DESCRIPTION OF THE DRAWINGS

The above objects and advantages of the present invention will become more apparent from the description of the preferred embodiments that follows with reference to the attached drawings in which.

DESCRIPTION OF THE PREFERRED EMBODIMENTS

Figure 1:
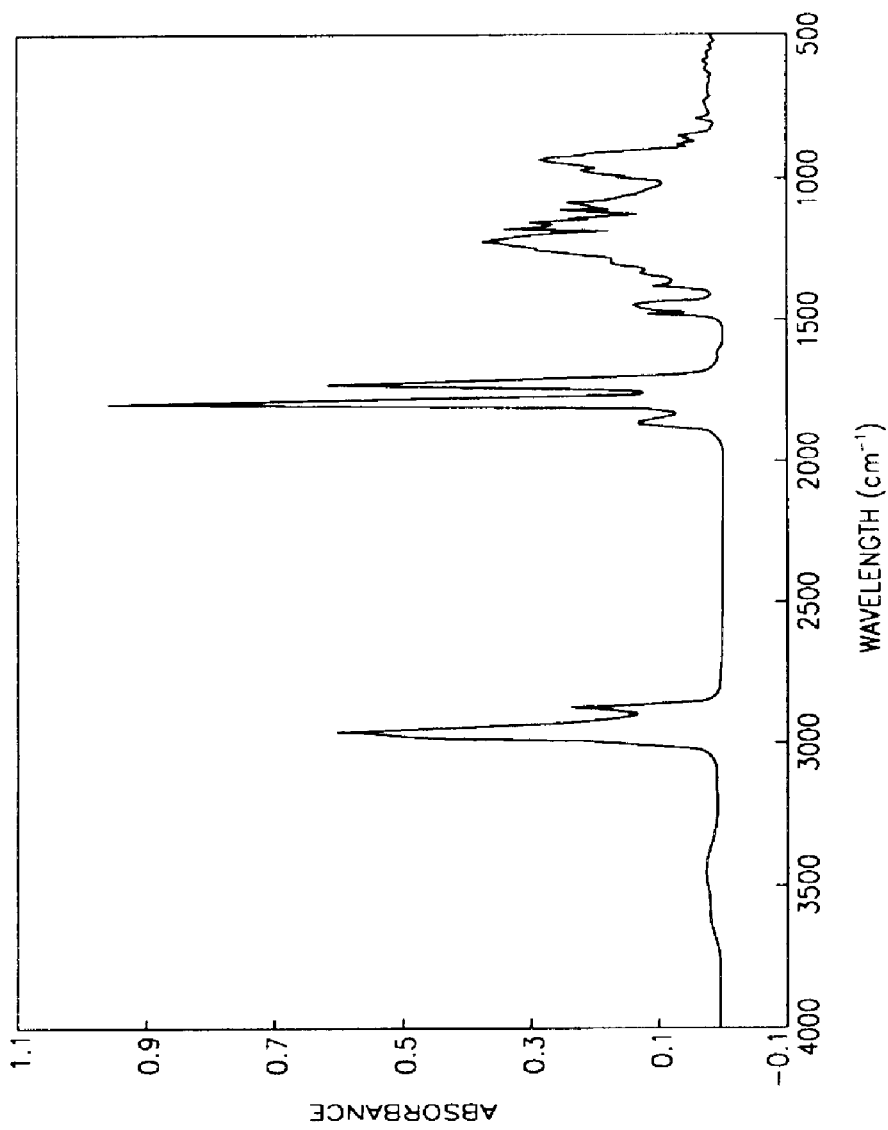
FIG. 1 illustrate a Fourier transfer infrared (FT-IR) spectrum result for a polymer contained in a resist composition according to the present invention.

The present invention is directed to a new polymer which overcomes disadvantages of existing polymers and provides a resist composition having excellent lithographic performance characteristics.

A resist composition according to the present invention is a photosensitive polymer having a new structure and includes a copolymer of alkyl vinyl ether monomers as a basic unit. In order to prepare the copolymer of alkyl vinyl ether monomers, an alkyl vinyl ether monomer and at least one other comonomer must be copolymerized. Here, examples of suitable comonomers include maleic anhydride, maleimide and the like. Also, examples of other comonomers suitable in the present invention include acrylate, methacrylate, fumarate, acrylonitrile, norbornene derivatives, styrene derivatives and the like.

Conventional radical polymerization methods can be used in preparing the copolymer. In addition, the copolymer can be prepared by cationic polymerization or anionic polymerization.

The most preferred copolymer in the present invention is a copolymer of an alkyl vinyl ether monomer and a maleic anhydride monomer. Here, in order to improve a dissolution property for an alkaline developer, the copolymer may be prepared using other additional monomers. Here, other additional monomers such as (meth)acrylate derivatives or norbornene derivatives are contemplated as suitable.

The alkyl vinyl ether used in the present invention is a linear alkyl vinyl ether and a cyclic alkyl vinyl ether, which are respectively represented by the structures

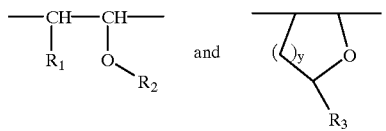

wherein y is one of the integer values 1 through 4, $R_1$ is a hydrogen atom or a methyl group, $R_2$ is a $C_1$ to $C_{20}$ hydrocarbon, and $R_3$ is a hydrogen atom, a $C_1$ to $C_3$ alkyl group or an alkoxy group. Here, $R_2$ or $R_3$ may have an acid-labile substituent. Examples of $R_2$ include methyl, ethyl, 2-hydroxy ethyl n-butyl and iso-butyl groups. $R_3$ may be either a methoxy group or an ethoxy group. For example, in the case where an alkyl vinyl ether monomer which can exist in the form of acetal, ketal or t-butyl ester is incorporated into the polymer backbone, the copolymer prepared by using only a maleic anhydride monomer as a comonomer copolymerized with the alkyl vinyl ether monomer can be used as a photosensitive resist material. The feature of these copolymers lies in that polymers of a more perfect alternating copolymer type can be obtained by general radical polymerization as compared to conventional cycloolefin-maleic anhydride (COMA) systems. Also, the yield of copolymers is much higher than that of conventional COMA systems.

Also, a resist layer formed with a resist composition according to the present invention obtained from a copolymer of an alkyl vinyl ether monomer and a maleic anhydride monomer demonstrates a relatively high transmittance at a short wavelength region, e.g., 193 nm, as well as at a DUV (deep ultraviolet) region, e.g., 248 nm. Further, the adhesion to film materials and wettability of the resist layer are excellent when compared to conventional materials. Thus, in the present invention, a polymer having a structure that advantageously may be used as a new resist material can be obtained.

Also, in order to enhance the property of the resist composition according to the present invention as a photosensitive resist material, the resist composition may be prepared by using a terpolymer or tetrapolymer obtained by copolymerizing a third or fourth monomer, in addition to a second polymer, a maleic anhydride monomer copolymerized with an alkyl vinyl ether monomer. Examples of monomers usable as the third or fourth monomer include (meth)acrylates having a bulky alicyclic protecting group or a polar group such as a hydroxyl or carboxyl group, and norbornene derivatives. The resist composition obtained from the terpolymer or tetrapolymer prepared by copolymerizing the above monomers exhibits improvements relating to resistance to dry etching and adhesion characteristics.

As described above, the resist composition according to the present invention has significantly improved characteristics in that, in addition to overcoming the dry etching resistance problems which are encountered by conventional resist materials obtained from polymers having the (meth) acrylate backbone, it can also overcome both the transmittance and adhesion problems which are encountered by conventional resist materials of COMA systems.

Also, since conventional COMA alternating copolymers have a very high glass transition temperature, that is, 200° C. or higher, due to their rigid backbones, processes in which they are used suffer several performance related drawbacks. On the other hand, a resist layer manufactured by the present invention has an appropriate glass transition temperature in the range of about 140 to 180° C. Thus, the resist layer manufactured by the photosensitive polymer according to the present invention undergoes a sufficient annealing effect during a baking process, so that the free volume therein can be reduced. Thus, the resist layer has an increased stability to the ambient atmosphere even in PED, thereby improving the lithographic performance thereof.

The resist composition according to the present invention will now be described in detail. The resist composition according to the present invention includes a copolymer of an alkyl vinyl ether monomer and at least one other comonomer. Among comonomers usable in the present invention, examples of a representative second monomer copolymerized with the alkyl vinyl ether monomer include maleic anhydride and maleimide. Alternative examples of the second monomer include (meth)acrylates, fumarates, acrylonitriles, norbornene derivatives and styrene derivatives.

In particular, in the present invention, an alternating copolymer of alkyl vinyl ether and maleic anhydride represented by the following formula was easily prepared by radical copolymerization:

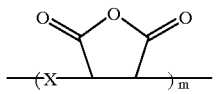

wherein X is one of a linear alkyl vinyl ether and a cyclic alkyl vinyl ether, which are respectively represented by the structures

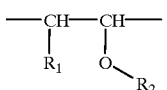 and 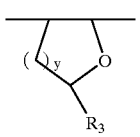

wherein y is one of the integer values 1 through 4, preferably 1 or 2, $R_1$ is a hydrogen atom or a methyl group, $R_2$ is a $C_1$ to $C_{20}$ hydrocarbon, and $R_3$ is a hydrogen atom, a $C_1$ to $C_3$ alkyl group or an alkoxy group. To improve adhesion characteristics, each of $R_2$ and $R_3$ independently may have a hydroxyl group or a carboxyl group. In particular, the alkyl vinyl ether may exist in the form of acetal or ketal or may have an acid-labile substituent such as t-butyl. In this case, even if the resist composition is manufactured by using only a copolymer of an alkyl vinyl ether monomer and maleic anhydride, it can be advantageously used as the photosensitive resist material. For example, an alternating copolymer of 6-ethoxy-2,3-dihydropyran and a maleic anhydride monomer can be advantageously used in manufacturing the resist composition according to the present invention.

In order to increase the solubility of the resist composition in an aqueous alkaline solution used as a developer during a photolithographic process, that is, in 2.38% by weight of tetramethylammonium-hydroxide (TMAH), and enhance the appropriate characteristics to be commercially used as resist materials, a third or fourth monomer is used in addition to a second monomer copolymerized with the alkyl vinyl ether monomer. Examples of a suitable third or fourth monomer include (meth)acrylates, fumarates, acrylonitriles, norbornene derivatives and styrene derivatives. Preferably, (meth)acrylate derivatives or norbornene derivatives are used as the third or fourth monomers.

Detailed examples of copolymers usable in the present invention include:

[Formula 1]

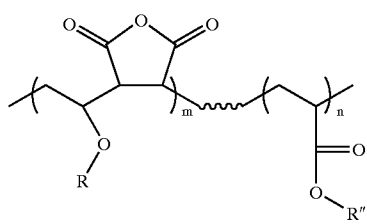

[Formula 2]

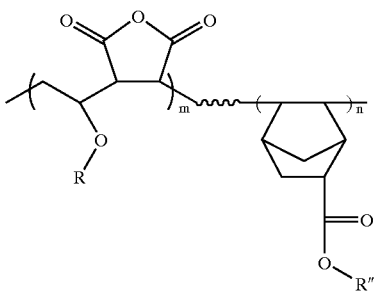

[Formula 3]

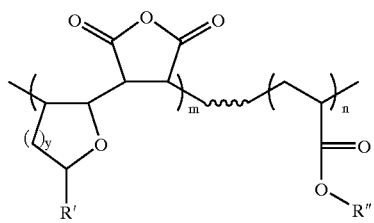

[Formula 4]

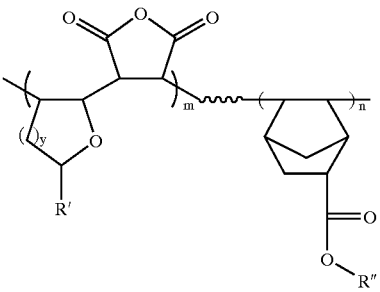

wherein R is an alkyl group, R' is a hydrogen atom, an alkyl or alkoxy group, R" is a hydrogen atom or a $C_1$ to $C_{20}$ hydrocarbon, preferably an acid-labile group, y is one of the integer values 1 through 4, m+n=1 and n/(m+n)=0.1 to 0.5. The value of n/(m+n) changes somewhat according to the kind of an alkyl vinyl ether monomer used. A value of n/(m+n) in the range of 0.2 to 0.4 is desirable for adjusting the overall solubility.

Preferably, R" is an acid-labile alicyclic hydrocarbon. Examples of the acid-labile alicyclic hydrocarbon includes 2-methyl-2norbornyl, 2-ethyl-2-norbornyl, 2-methyl-2-isobornyl, 2-ethyl-2-isobornyl, 8-methyl-8-tricyclo[5.2.1.0$^{2.6}$]decanyl, 8-ethyl-8-tricyclo[5.2.1.0$^{2.6}$]decanyl, 2-methyl-2-adamantyl, 2-ethyl-2-adamantyl, 2-methyl-2-fenchyl or 2-ethyl-2-fenchyl group.

In order to prepare the resist composition according to the present invention, copolymers prepared as described above are dissolved in various solvents such as propylene glycol monomethyl ether acetate, ethyl lactate or cyclohexanone with a photoacid generator (PAG) to produce resist solutions. Here, the content of solid matter contained in the resist solution is about 10 to about 20% by weight based on the total weight of the obtained solvent. If necessary, about 0.5 to 50 mol % of an organic base such as amine is added to the resist solution, based on the concentration of the PAG. Preferably, the organic base is a compound comprising tertiary amine alone or in a mixture of at least two kinds thereof. Examples of organic bases include triethylamine, triisobutylamine, trioctylamine, triisodecylamine, triethanolamine, N,N-dimethyl-1-naphthylamines, N-cyclohexyl pyrrolidinone, N-cyclopentyl pyrrolidinone, N-pentyl pyrrolidinone, N-hexyl pyrrolidinone, N-allyl caprolactam, N-ethyl caprolactam, N-butyl caprolactam, N-propyl caprolactam, N-butyl valerolactam, N-isobutyl valerolactam, and N-secondary butyl valerolactam, or mixtures thereof. Also, in order to adjust the overall dissolution rate of the resist layer, about 5 to 25% by weight of a dissolution inhibitor may be added, based on the weight of the copolymer.

The PAG is used in an amount of about 0.5 to about 20% by weight. For example, PAGs such as inorganic onium salts or organic sulfonates can be suitably used alone or in a mixture of at least two kinds of materials. Examples of suitable PAGs include triarylsulfonium triflates, diaryliodonium triflates, triarylsulfonium nonaflates, diaryliodonium nonaflates, succinimidyl triflates, 2,6-dinitrobenzyl sulfonates and so on. Further examples of PAGs include triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylslulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenysulfonium perfluorooctanesulfonate (PFOS), diphenyliodonium PFOS, methoxydiphenyliodonium PFOS, di-t-butyldiphenyliodonium triflate, N-hydroxysuccinimide PFOS, and norbornene-dicarboximide PFOS, or mixtures thereof.

In order to carry out a lithographic process, the resist solution is first filtered about twice using a membrane filter to yield a resist composition.

In order to form a pattern using the resist composition obtained in the above-described manner, the following procedure is carried out.

A bare silicon wafer or a silicon wafer having an underlying film material such as silicon oxide, silicon nitride or silicon oxynitride thereon is prepared, and then treated with hexamethyldisilazane (HMDS). Then, the resist composition is coated on the silicon oxide to a thickness of about 0.2 to about 0.7 μm to form a resist layer.

The silicon wafer having the resist layer is pre-baked at a temperature in the range of about 90 to 150° C. for about 60 to 120 seconds to remove the solvent. Then, the resultant structure is exposed to light using a variety of exposure sources, for example, deep ultraviolet (DUV) radiation such as KrF or ArF, extreme ultraviolet (EUV) radiation, E-beam radiation or X-ray radiation, and then post-exposure baking (PEB) is performed at a temperature in the range of about 90 to 150° C. for about 60 to 120 seconds to cause a chemical reaction at an exposed area of the resist layer.

Here, the resist layer exhibits a very high solubility to a developer mostly consisting of 2.38% by weight of a TMAH solution at the exposed area thereof, so that it is well dissolved for removal during development. In the case where an ArF excimer laser is used as the exposure source, a line and space pattern of about 0.3 to about 0.15 μm can be formed at an exposure dose of about 5 to about 30 mJ/cm².

The underlying film material such as silicon oxide is etched by a specific etching gas, for example, a plasma such as a halogen gas or a $C_xF_y$ gas using the resist pattern which is obtained according to the above process as a mask. Then, the resist pattern remaining on the wafer is removed using a stripper to form a desired silicon oxide pattern.

The following examples are detailed description of methods of preparation and use of the present invention and technical inferences that can be readily made by one skilled in the art are not described herein. Unless otherwise specified, all of the reagents specified for description of the present invention were obtained from Aldrich Chemical Co.

SYNTHESIS EXAMPLE 1

Preparation of Copolymer

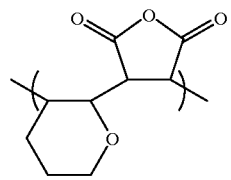

3,4-dihydro-2H-pyran(2,3-dihydropyran) (2.1 g; 25 mmol), refined maleic anhydride (2.45 g; 25 mmol) and 2,2'-azobisisobutyronitrile (AIBN) (0.328 g; 4 mole percent) were put into a one-necked round-bottom flask to then be dissolved in 9 g of anhydrous tetrahydrofuran (THF). Then, the mixture was degassed by three freeze-pump thaw cycles in a liquid nitrogen bath and sealed. Thereafter, polymerization was performed in an oil bath at 65° C. for about 24 hours.

After the reaction was completed, the reactant was dissolved in an appropriate amount of THF (20 mL) and was then slowly dropped into excess n-hexane (tenfold) and precipitated. The precipitated product was redissolved in THF (20 mL) and then reprecipitated in a mixed solution of excess n-hexane and isopropyl alcohol in a mixing ratio of 8:2. The precipitated polymer was dried at a vacuum oven maintained at 50° C. for 24 hours to obtain the copolymer having the above formula (Yield: 80%). The weight average molecular weight (Mw) and polydispersity (Mw/Mn) of the obtained polymer were 7,800 and 1.8, respectively.

SYNTHESIS EXAMPLE 2

Preparation of Copolymer

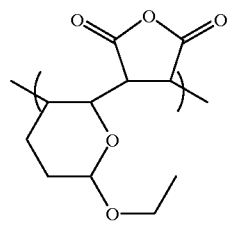

3,4-dihydro-2-ethoxy-2H-pyran(6-ethoxy-2,3-dihydropyran) (3.2 g; 25 mmol), refined maleic anhydride (2.45 g; 25 mmol) and AIBN (0.328 g; 4 mole percent) were put into a one-necked round-bottom flask to then be dissolved in 10 g of THF. Then, a copolymer represented by the above formula was prepared in the same manner as in Synthesis Example 1 (Yield: 81%).

SYNTHESIS EXAMPLE 3

Preparation of Copolymer

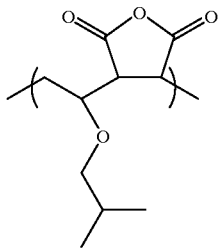

Isobutyl vinyl ether (2.5 g; 25 mmol), refined maleic anhydride (2.45 g; 25 mmol) and AIBN (0.328 g; 4 mole percent) were put into a one-necked round-bottom flask to then be dissolved in 10 g of THF. Then, a copolymer represented by the above formula was prepared in the same manner as in Synthesis Example 1 (Yield: 85%).

SYNTHESIS EXAMPLE 4

Preparation of Copolymer

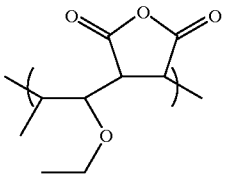

Ethyl 1-propenyl ether (2.15 g; 25 mmol), refined maleic anhydride (2.45 g; 25 mmol) and AIBN (0.41 g; 5 mole percent) were put into a one-necked round-bottom flask to then be dissolved in 9 g of THF. Then, a copolymer represented by the above formula was prepared in the same manner as in Synthesis Example 1 (Yield: 81%).

SYNTHESIS EXAMPLE 5

Preparation of Copolymer

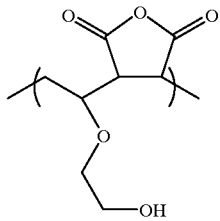

Ethylene glycol vinyl ether (2.2 g; 25 mmol), refined maleic anhydride (2.45 g; 25 mmol) and AIBN (0.328 g; 4 mole percent) were put into a one-necked round-bottom flask to then be dissolved in 9 g of THF. Then, polymerization was carried out in the same manner as in Synthesis Example 1 and precipitated in n-hexane two times to prepare a copolymer represented by the above formula (Yield: 78%).

SYNTHESIS EXAMPLE 6

Preparation of Terpolymer [poly(DHP-MA-ETCDA)]

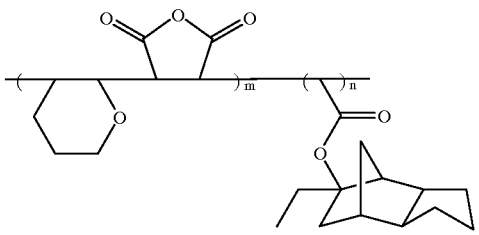

3,4-dihydro-2H-pyran(DHP) (0.84 g; 10 mmol), refined maleic anhydride (MA) (5.88 g; 60 mmol), 8-ethyl-8-tricyclo[5.2.1.0$^{2,6}$]decanyl acrylate (ETCDA) (7.03 g; 30 mmol), synthesized as described in *SPIE,* vol. 3678, p 510, 1999, and AIBN (0.82 g; 5 mole percent) were put into a one-necked round-bottom flask to then be dissolved in THF (7 g; half times the total weight of monomers). Then, the mixture was degassed by three freeze-pump thaw cycles in a liquid nitrogen bath and sealed. Thereafter, polymerization was performed in an oil bath at 650° C. for about 24 hours.

After the reaction was completed, the reactant was dissolved in an appropriate amount of THF (80 mL) and was then slowly dropped into excess isopropyl alcohol (IPA) (1 L) and precipitated. The precipitated product was redissolved in THF (100 mL) and then reprecipitated two times in excess IPA solvent (10 times the volume of THF). The precipitated polymer was dried at a vacuum oven maintained at 50° C. for 24 hours to obtain the copolymer having the above formula (Yield: 70%).

In preparing the terpolymer represented by the above formula, the mixing ratio of monomers used for adjusting the overall solubility of the polymer can be varied. Synthesis Examples of three terpolymers synthesized by varying the mixing ratio of monomers are shown in Table 1.

TABLE 1

| Sample No. | Mixing ratio of monomers (DHP:MA:ETCDA) | AIBN (mol %) | S/M | Polymerization time (hr) | Mw | Mw/Mn |
|---|---|---|---|---|---|---|
| 1 | 1:8:3 | 2 | 0.4 | 24 | 12100 | 1.9 |
| 2 | 1:6:3 | 5 | 0.4 | 24 | 8800 | 1.8 |
| 3 | 1:1:1 | 5 | 0.5 | 24 | 9300 | 1.8 |

In Table 1, "S/M" indicates a weight ratio of monomer to solvent. As shown in Table 1, when terpolymers were synthesized by mixing monomers in various mixing ratios, the resultant products demonstrated excellent characteristics as resist materials. In particular, sample 2 had the most desirable characteristics.

FIG. 1 illustrates the Fourier Transfer Infrared (FT-IR) spectrum characteristics for the sample 1 of Table 1 using KBr pellets.

SYNTHESIS EXAMPLE 7

Preparation of Terpolymer [poly(DHEP-MA-ETCDA)]

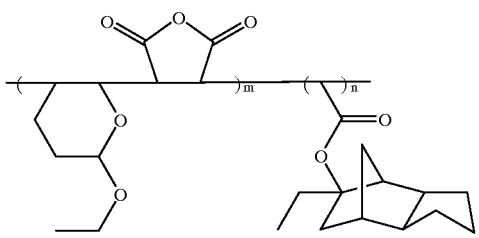

3,4-dihydro-2-ethoxy-2H-pyran (DHEP) (1.28 g; 10 mmol), refined maleic anhydride (MA) (5.88 g; 60 mmol), 8-ethyl-8-tricyclo[5.2.1.0$^{2.6}$]decanyl acrylate (ETCDA) (7.03 g; 30 mmol), and AIBN (0.82 g; 5 mole percent) were put into a one-necked round-bottom flask to then be dissolved in 8 g of THF, and then the terpolymer represented by the above formula was prepared in the same manner as in Synthesis Example 6 (Yield: 68%).

SYNTHESIS EXAMPLE 8

Preparation of Terpolymer

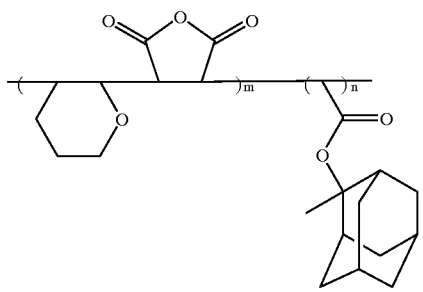

3,4-dihydro-2H-pyran (0.84 g; 10 mmol), refined maleic anhydride (7.84 g; 80 mmol), 2-methyl-2-adamantyl methacrylate (7.03 g; 30 mmol), synthesized as described in *SPIE*, vol. 3678, p 510, 1999, and AIBN (5 mole percent) were put into a one-necked round-bottom flask to then be dissolved in 9 g of THF, and then the terpolymer represented by the above formula was prepared in the same manner as in Synthesis Example 6 (Yield: 70%).

SYNTHESIS EXAMPLE 9

Preparation of Terpolymer

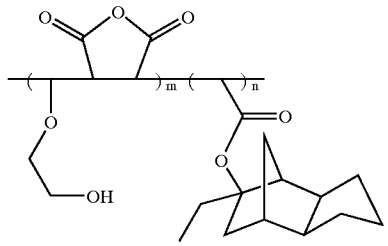

Ethylene glycol vinyl ether (0.26 g; 3 mmol), refined maleic anhydride (5.88 g; 60 mmol), 8-ethyl-8-tricyclodecanyl acrylate (6.33 g; 27 mmol), and AIBN (0.39 g; 2 mole percent) were put into a one-necked round-bottom flask to then be dissolved in 6 g of THF, and then the terpolymer represented by the above formula was prepared in the same manner as in Synthesis Example 6 (Yield: 70%).

SYNTHESIS EXAMPLE 10

Preparation of Terpolymer

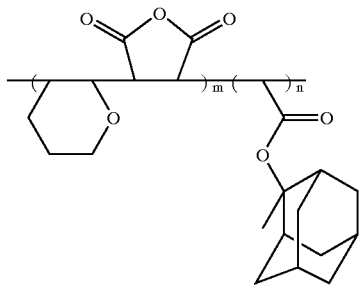

3,4-dihydro-2-ethoxy-2H-pyran (0.84 g; 10 mmol), refined maleic anhydride (7.84 g; 80 mmol), 2-methyl-2-adamantyl acrylate (8.81 g; 40 mmol), and AIBN (1.06 g; 5 mole percent) were put into a one-necked round-bottom flask to then be dissolved in 9 g of THF, and then the terpolymer represented by the above formula was prepared in the same manner as in Synthesis Example 6 (Yield: 72%).

SYNTHESIS EXAMPLE 11

Preparation of Terpolymer

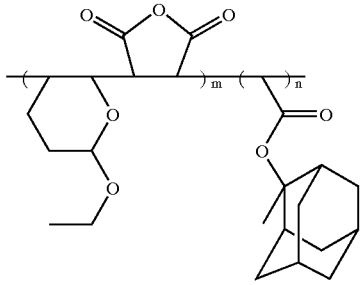

3,4-dihydro-2-ethoxy-2H-pyran (1.28 g; 10 mmol), refined maleic anhydride (5.88 g; 60 mmol), 2-methyl-2-adamantyl methacrylate (7.03 g; 30 mmol), and AIBN (0.82 g; 5 mole percent) were put into a one-necked round-bottom flask to then be dissolved in 8 g of THF, and then the terpolymer represented by the above formula was prepared in the same manner as in Synthesis Example 6 (Yield: 66%).

SYNTHESIS EXAMPLE 12

Preparation of Terpolymer

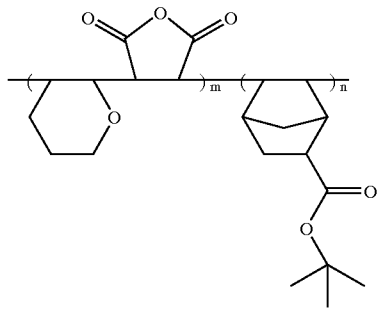

3,4-dihydro-2H-pyran (0.84 g; 10 mmol), refined maleic anhydride (4.9 g; 50 mmol), t-butyl-5-norbornene-2-carboxylate (7.77 g; 40 mmol), and AIBN (0.82 g; 5 mole percent) were put into a one-necked round-bottom flask to then be dissolved in 7 g of THF, and then the terpolymer represented by the above formula was prepared in the same manner as in Synthesis Example 6 (Yield: 67%).

SYNTHESIS EXAMPLE 13

Preparation of Terpolymer

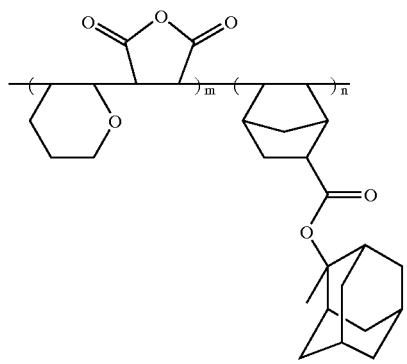

3,4-dihydro-2H-pyran (0.84 g; 10 mmol), refined maleic anhydride (4.9 g; 50 mmol), 2-methyl-2-adamantyl 5-norbornene-2-carboxylate (11.46 g; 40 mmol), and AIBN (0.82 g; 5 mole percent) were put into a one-necked round-bottom flask to then be dissolved in 8 g of THF, and then the terpolymer represented by the above formula was prepared in the same manner as in Synthesis Example 6 (Yield: 65%).

SYNTHESIS EXAMPLE 14

Preparation of Terpolymer

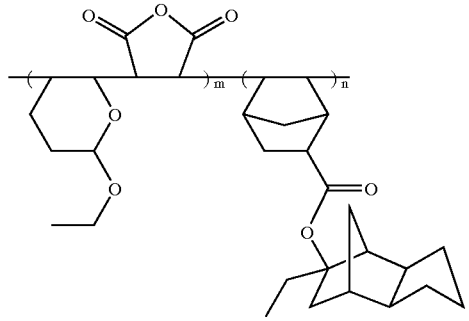

3,4-dihydro-2-ethoxy-2H-pyran (1.28 g; 10 mmol), refined maleic anhydride (4.9 g; 50 mmol), 8-ethyl-8-tricyclodecanyl 5-norbornene-2-carboxylate (12.0 g; 40 mmol), and AIBN (0.82 g; 5 mole percent) were put into a one-necked round-bottom flask to then be dissolved in 8 g of THF, and then the terpolymer represented by the above formula was prepared in the same manner as in Synthesis Example 6 (Yield: 67%).

SYNTHESIS EXAMPLE 15

Preparation of Terpolymer

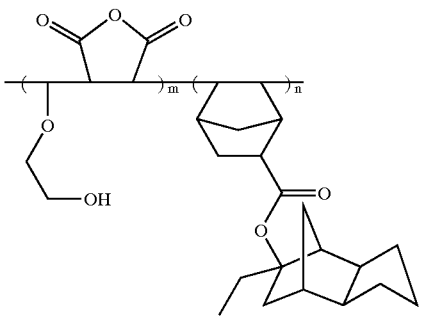

Ethylene glycol vinyl ether (0.44 g; 5 mmol), refined maleic anhydride (4.9 g; 50 mmol), 8-ethyl-8-tricyclodecanyl 5-norbornene-2-carboxylate (13.5 g; 45 mmol), and AIBN (0.82 g; 5 mole percent) were put into a one-necked round-bottom flask to then be dissolved in 8 g of THF, and then the terpolymer represented by the above formula was prepared in the same manner as in Synthesis Example 6 (Yield: 63%).

SYNTHESIS EXAMPLE 16

Preparation of Terpolymer

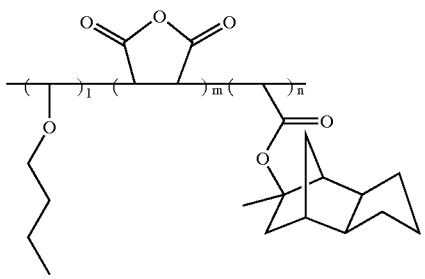

Butyl vinyl ether (0.5 g; 5 mmol), refined maleic anhydride (3.92 g; 40 mmol), 8-methyl-8-tricyclodecanyl acrylate (4.4 g; 20 mmol), and AIBN (0.53 g; 5 mole percent) were put into a one-necked round-bottom flask to then be dissolved in 4 g of THF, and then the terpolymer represented by the above formula was prepared in the same manner as in Synthesis Example 6 (Yield: 68%).

SYNTHESIS EXAMPLE 17

Preparation of Terpolymer

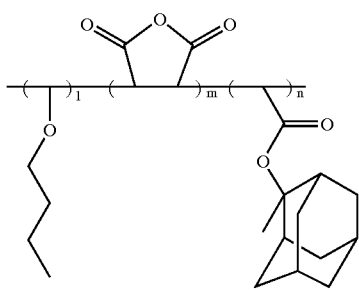

Butyl vinyl ether (1.0 g; 10 mmol), refined maleic anhydride (7.84 g; 80 mmol), 2-methyl-2-adamantyl acrylate (8.8 g; 40 mmol), and AIBN (1.0 g; 5 mole percent) were put into a one-necked round-bottom flask to then be dissolved in 8 g of THF, and then the terpolymer represented by the above formula was prepared in the same manner as in Synthesis Example 6 (Yield: 72%).

SYNTHESIS EXAMPLE 18

Preparation of Tetrapolymer

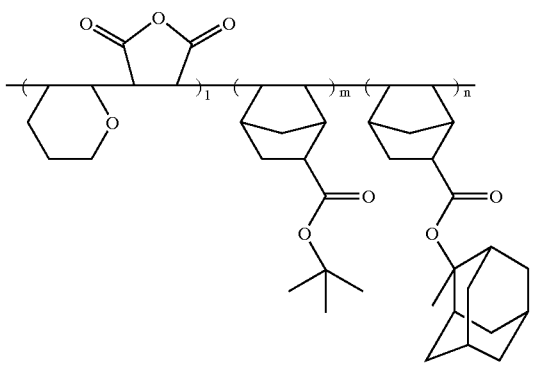

3,4-dihydro-2H-pyran (1.68 g; 20 mmol), refined maleic anhydride (MA) (4.9 g; 50 mmol), t-butyl 5-norbornene-2-carboxylate (3.89 g; 20 mmol), 2-methyl-2-adamantyl 5-norbornene-2-carboxylate (2.89 g; 10 mmol), and AIBN (0.82 g; 5 mole percent) were put into a one-necked round-bottom flask to then be dissolved in 7 g of THF, and then the terpolymer represented by the above formula was prepared in the same manner as in Synthesis Example 6 (Yield: 65%).

SYNTHESIS EXAMPLE 19

Preparation of Tetrapolymer

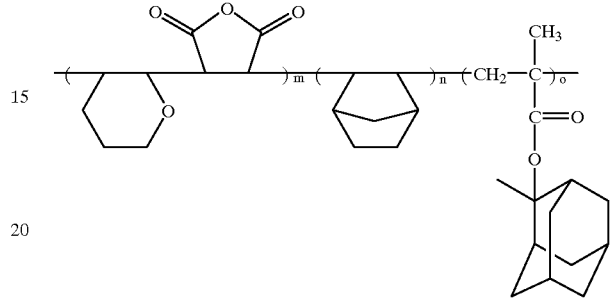

3,4-dihydro-2H-pyran (1.68 g; 20 mmol), refined maleic anhydride (MA) (5.9 g; 60 mmol), norbornylene (3.77 g; 40 mmol), 2-methyl-2-adamantyl methacrylate (18.7 g; 80 mmol), and AIBN (1.64 g; 5 mole percent) were put into a one-necked round-bottom flask to then be dissolved in 15 g of THF, and then the terpolymer represented by the above formula was prepared in the same manner as in Synthesis Example 6 (Yield: 85%).

EXAMPLE 1

Preparation of Resist Composition 1.0 g of the terpolymer prepared in Synthesis Example 6 (Sample No. 2 of Table 1), 10 mg of a photoacid generator (PAG), triphenylsulfonium trifluoromethanesulfonate (triflate), and an organic base, triisobutylamine, (20 mole percent based on the concentration of the PAG) were completely dissolved in 8.0 g of propylene glycol monomethyl ether acetate (PGMEA). Subsequently, the mixture was filtered using a 0.2 µm filter to obtain a resist composition. The resist composition was then coated on a silicon wafer which was HMDS-treated at about 3000 RPM to a thickness of about 0.3 µm.

Then, the coated wafer was soft-baked at 130° C. for 90 seconds, exposed using an ArF excimer laser stepper, manufactured by ISI Co., Ltd., (NA=0.6; σ=0.7) and then post-exposure baking (PEB) was performed at 120° C. for 90 seconds.

Thereafter, the resultant was developed using 2.38% by weight of TMAH for about 60 seconds, thereby forming a resist pattern. As a result, a 0.18 to 0.22 µm line and space photoresist pattern was obtained at an exposure dose of about 8 to about 20 mJ/cm².

Figure 2:
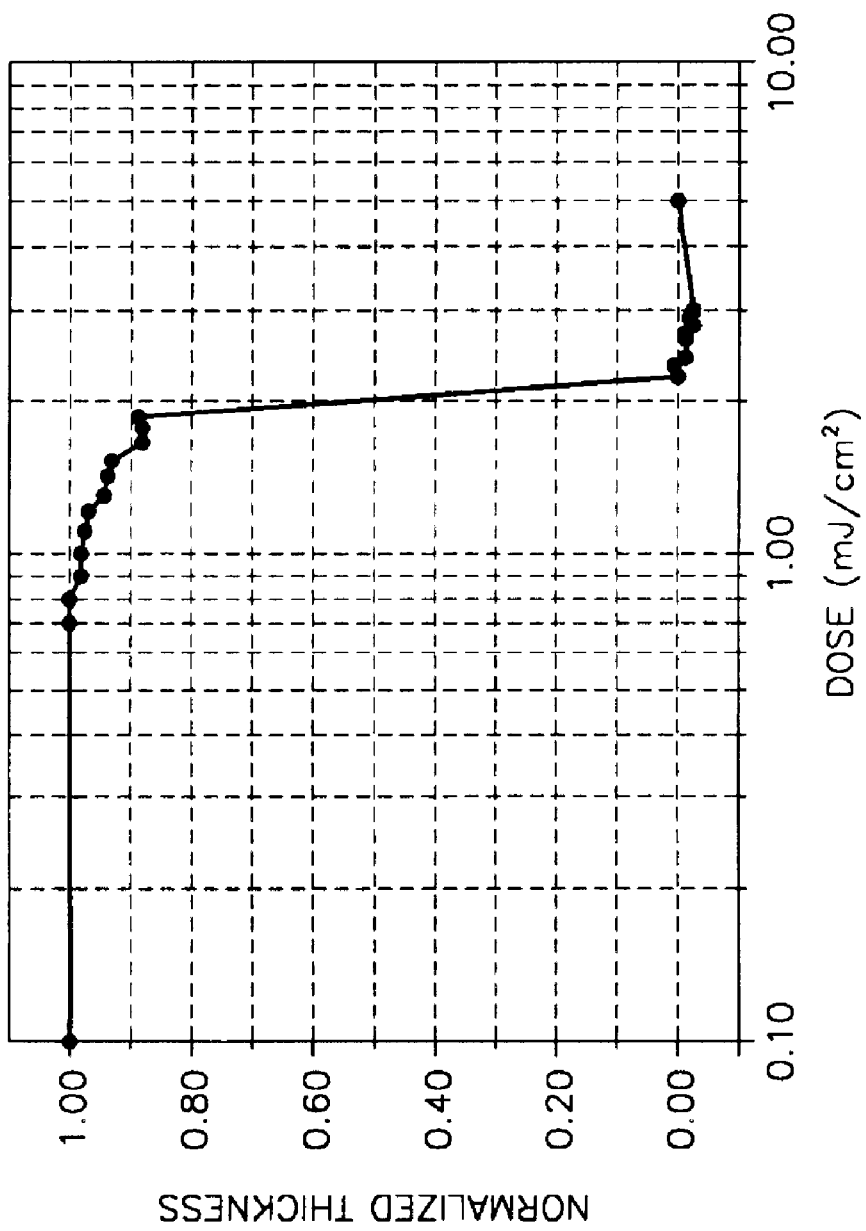
FIG. 2 illustrates evaluation results of contrast characteristics of a resist composition according to the present invention.

FIG. 2 illustrates the normalized thickness of a resist layer remaining on an exposed region in units of micrometers (µm), the resist layer formed by coating the resist composition prepared in this embodiment on a wafer, when the initial thickness of the resist is set to 1 µm. As shown in FIG. 2, the thicknesses of the resist layer sharply decreased at an exposure dose of a predetermined level or higher. From this result, it can be seen that the resist composition prepared by this embodiment has a high contrast.

EXAMPLE 2

Preparation of Resist Composition 1.0 g of the terpolymer prepared in Synthesis Example 6 (Sample No. 2 of Table 1), 10 mg of a PAG, triphenylsulfonium and 10 mg of triphenylsulfonium, nonafluorobuthanesulfonate(nonaflate), and an organic base, triisodecylamine, (30 mole percent based on the concentration of the PAG) were completely dissolved in 8.0 g of PGMEA. Subsequently, the mixture was filtered using a 0.2 µm membrane filter to obtain a resist composition. The resist composition was then coated on a silicon wafer which was HMDS-treated at about 3000 RPM to a thickness of about 0.3 µm.

Then, the coated wafer was soft-baked at 130° C. for 90 seconds, exposed using an ArF excimer laser stepper, manufactured by ISI Co., Ltd., (NA=0.6; σ=0.7) and then PEB was performed at 120° C. for 90 seconds.

Thereafter, the resultant was developed using 2.38% by weight of TMAH for about 60 seconds, thereby forming a resist pattern. As a result, a 0.18 to 0.22 µm line and space photoresist pattern was obtained at an exposure dose of about 10 to about 30 mJ/cm$^2$.

EXAMPLE 3

Preparation of Resist Composition 1.0 g of poly(DHEP$_{10}$-MA$_{60}$-ETCDA$_{30}$) (Mw=8600; polydispersity=1.9), prepared in Synthesis Example 7, 10 mg of a PAG, triphenylsulfonium triflate, and an organic base, triisodecylamine, (15 mole percent based on the concentration of the PAG) were completely dissolved in 8.0 g of PGMEA. Subsequently, the mixture was filtered using a 0.2 µm membrane filter to obtain a resist composition. The resist composition was then coated on a silicon wafer which was HMDS-treated at about 3000 RPM to a thickness of about 0.3 µm.

Then, the coated wafer was soft-baked at 130° C. for 90 seconds, exposed using an ArF excimer laser stepper, manufactured by ISI Co., Ltd., (NA=0.6; σ=0.7) and then PEB was performed at 120° C. for 90 seconds.

Thereafter, the resultant was developed using 2.38% by weight of TMAH for about 60 seconds, thereby forming a resist pattern. As a result, a 0.18 to 0.22 µm line and space photoresist pattern was obtained at an exposure dose of about 10 to about 30 mJ/cm$^2$.

EXAMPLE 4

Preparation of Resist Composition

Polymers prepared in Synthesis Examples 8 through 18, a PAG, triphenylsulfonium triflate or triphenylsulfonium nonaflate, (1 to 3 weight percent), and an organic base, amine, (0.5 to 50 mole percent based on the concentration of the PAG) were completely dissolved in PGMEA, ethyl lactate (EL) or a co-solvent (10 to 15 weight percent based on the total weight of solid matter). Subsequently, the mixture was filtered using a 0.2 µm membrane filter to obtain a resist composition. The resist composition was then coated on a silicon wafer which was HMDS-treated at about 3000 RPM to a thickness of about 0.2 to 0.5 µm.

Then, the coated wafer was soft-baked at 110 to 150° C. for 90 seconds, exposed using an ArF excimer laser stepper, manufactured by ISI Co., Ltd., (NA=0.6; σ=0.7) and then PEB was performed at 100 to 140° C. for 90 seconds.

Thereafter, the resultant was developed using 2.38% by weight of TMAH for about 30 to about 90 seconds, thereby forming a resist pattern. As a result, a 0.18 to 0.24 µm line and space photoresist pattern was obtained at an exposure dose of about 5 to about 50 mJ/cm$^2$.

EVALUATION EXAMPLE 1

Evaluation of Resistance to Dry Etching

In order to evaluate resistance to dry etching of resist compositions prepared in the same manner as in Example 1 using the terpolymer prepared in Synthesis Example 6, polymers of sample Nos. 1, 2 and 3 of Table 1, (hereinafter referred to as "resist-1", "resist-2" and "resist-3") were coated on wafers and then relative etch rates thereof were measured using the Rainbow 4500, which is a dry etching apparatus available from LAM Research Corporation. Here, for comparison, a DUV resist, SEPR-430S available from ShinEtsu Chemical Co., Ltd., which is commercially used as a KrF resist, and PAR-101 which is an ArF resist commercially available from Sumitomo Chemical Co., Ltd. were evaluated in the same manner. In Table 2, "Relative etch rate" indicates each relative etch rate calculated in the case where the etch rate of SEPR-430S is set to 1.00. Here, dry etching was performed for 120 seconds under the conditions in which etching gases, Ar, CF$_4$ and CHF$_3$, were flowed at flow rates of 300 sccm, 10 sccm and 10 sccm, respectively, while applying a pressure of 150 mT and a power of 700 W. The results of dry etching are shown in Table 2.

TABLE 2

| Kind of resist | Etch rate (Å/min) | Relative etch rate |
| --- | --- | --- |
| SEPR-430S | 465 | 1.00 |
| PAR-101 | 572 | 1.23 |
| Resist-1 | 503 | 1.08 |
| Resist-2 | 474 | 1.02 |
| Resist-3 | 475 | 1.02 |

As shown in Table 2, the resist compositions according to the present invention demonstrated dry etching resistance substantially equal to that of KrF resist compositions which are currently commercially available, and much improved resistance than that of PAR-101, which is a conventional methacrylate type resist composition. In the case of resist-1 obtained from Sample 1, since the content of maleic anhydride is higher than that of resist-2 or resist-3, the content of oxygen atoms (O) is relatively high, resulting in a rather low resistance to dry etching. However, the resultant resistance obtained from resist-1 constitutes a superior value compared to those of conventional ArF resist compositions.

EVALUATION EXAMPLE 2

Evaluation of Surface Roughness

In order to evaluate the surface roughness of a resist layer comprising the resist composition according to the present invention, dry etching was performed on various test objects used in Evaluation Example 1 and then the surfaces of resultant wafers were observed. The result showed that the surface of PAR-101 was considerably damaged, resulting in roughened surfaces.

On the other hand, the resist-1, the resist-2 and the resist-3 according to the present invention showed clean surface states with less damage. Therefore, when dry etching is performed on underlying film materials using a resist pattern obtained by patterning a resist layer during an actual process, the resist compositions according to the present invention exhibit an improved edge roughness when compared to the conventional methacrylate polymers since the dry etching resistance of the resist pattern is favorable.

The resist compositions according to the present invention which are obtained from a copolymer of an alkyl vinyl ether monomer and a second monomer such as maleic anhydride are very low in manufacturing costs and can overcome or mitigate problems encountered by the conventional polymers consisting of (meth)acrylate monomers. The resist compositions obtained from the copolymer according to the present invention can provide improved adhesion to underlying film materials and improved resistance to dry etching, thereby noticeably improving the transmittance of a polymer.

Also, a photosensitive polymer contained in the resist composition according to the present invention has an appropriate glass transition temperature in the range of about 140 to about 180° C. Therefore, a resist layer manufactured from the photosensitive polymer according to the present invention has a reduced free volume therein as a result of a sufficient annealing effect during a baking process. Thus, the resist layer has an enhanced stability to an ambient atmosphere even in post-exposure delay (PED). Therefore, when applied to a photolithographic process, the resist composition according to the present invention exhibits favorable lithographic performance characteristics, thereby being capable of use in the manufacture of next generation semiconductor devices.

Although the present invention has been described with respect to preferred embodiments, the invention is not limited thereto and it will be apparent that various changes and modifications may be effected by one skilled in the art within the scope of the invention.

What is claimed is:

1. A photosensitive terpolymer comprising:
   (a) a copolymer of alkyl vinyl ether and maleic anhydride, represented by the following structure:

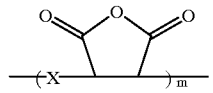

wherein X is a linear alkyl vinyl ether represented by the structure

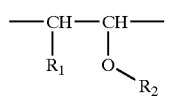

wherein $R_1$ is one of a hydrogen atom and a methyl group, and $R_2$ is a $C_1$ to $C_{20}$ hydrocarbon
   (b) a comonomer having an acid-labile substituent.

2. The photosensitive terpolymer according to claim 1, wherein $R_2$ is one of a methyl group, an ethyl group, a 2-hydroxy ethyl group, an n-butyl group and an iso-butyl group.

3. The photosensitive terpolymer according to claim 1, wherein the comonomer includes an acrylate derivative, a methacrylate derivative, a fumarate derivative, a styrene derivative or norbornene derivative.

4. The photosensitive terpolymer according to claim 1, wherein the comonomer has an alicyclic hydrocarbon group as the substituent.

5. The photosensitive terpolymer according to claim 1, wherein the comonomer is an acrylate or methacrylate derivative and the photosensitive terpolymer is represented by the following formula and has the weight average molecular weight of the polymer is in the range of 3,000 to 100,000:

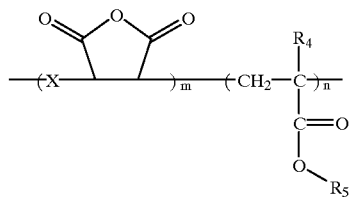

wherein $R_4$ is one of a hydrogen atom and a methyl group, $R_5$ is an acid-labile $C_2$ to $C_{20}$ hydrocarbon group, and n/(m+n)=0.1 to 0.7.

6. The photosensitive terpolymer according to claim 5, wherein $R_5$ is a t-butyl group.

7. The photosensitive terpolymer according to claim 5, wherein $R_5$ is an acid-labile alicyclic hydrocarbon group.

8. The photosensitive terpolymer according to claim 5, wherein $R_5$ is one of a 2-methyl-2-norbornyl group, a 2-ethyl-2-norbornyl group, a 2-methyl-2-isobornyl group, a 2-ethyl-2-isobornyl group, a 8-methyl-8-tricyclo[5.2.1.0$^{2.6}$] decanyl group, a 8-ethyl-8-tricyclo[5.2.1.0$^{2.6}$]decanyl group, a 2-methyl-2-adamantyl group, a 2-ethyl-2-adamantyl group, a 2-methyl-2-fenchyl group and a 2-ethyl-2-fenchyl group.

9. The photosensitive terpolymer according to claim 1, wherein the comonomer is a norbornene derivative and the photosensitive terpolymer is represented by the following formula and has the weight average molecular weight of the polymer is in the range of 3,000 to 100,000:

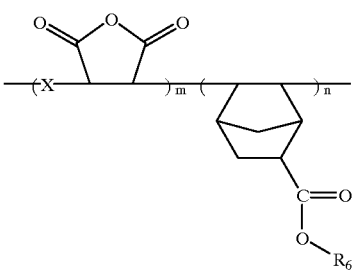

wherein $R_6$ is one of a hydrogen atom and an acid-labile $C_2$ to $C_{20}$ hydrocarbon group, and n/(m+n)=0.1 to 0.7.

10. The photosensitive terpolymer according to claim 9, wherein $R_6$ is a t-butyl group.

11. The photosensitive terpolymer according to claim 9, wherein $R_6$ is an acid-labile alicyclic hydrocarbon group.

12. The photosensitive terpolymer according to claim 11, wherein $R_6$ is one of a 2-methyl-2-norbornyl group, a 2-ethyl-2-norbornyl group, a 2-methyl-2-isobornyl group, a 2-ethyl-2-isobornyl group, a 8-methyl-8-tricyclo[5.2.1.0$^{2.6}$] decanyl group, a 8-ethyl-8-tricyclo[5.2.1.0$^{2.6}$]decanyl group, a 2-methyl-2-adamantyl group, a 2-ethyl-2-adamantyl group, a 2-methyl-2-fenchyl group and a 2-ethyl-2-fenchyl group.

13. A photosensitive polymer comprising:
   (a) a copolymer of alkyl vinyl ether and maleic anhydride, represented by the following structure:

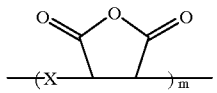

wherein X is a linear alkyl vinyl ether represented by the structure

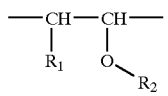

wherein $R_1$ is one of a hydrogen atom and a methyl group, and $R_2$ is a $C_1$ to $C_{20}$ hydrocarbon; and (b) at least two comonomers consisting of acrylate, methacrylate or norbornene derivatives having an acid-labile substituent or a polar functional group.

14. The photosensitive polymer according to claim 13, wherein $R_2$ is one of a methyl group, an ethyl group, a 2-hydroxy ethyl group, an n-butyl group and an iso-butyl group.

15. A photosensitive polymer represented by the following structure:

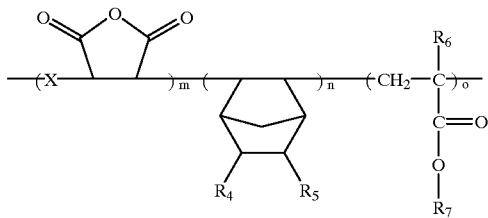

wherein X is a linear alkyl vinyl ether represented by the structure

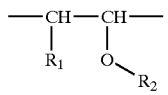

wherein $R_1$ is one of a hydrogen atom and a methyl group, and $R_2$ is a $C_1$ to $C_{20}$ hydrocarbon; and wherein $R_4$ and $R_5$ independantly are one of hydrogen atom and $C_1$ to $C_{25}$ aliphatic hydrocarbon, $R_6$ is one of hydrogen atom and a methyl group, $R_7$ is an acid-labile $C_2$ to $C_{20}$ hydrocarbon group, n/(m+n+o)=0.1 to 0.7, and o/(m+n+o)=0.1 to 0.7.

16. The photosensitive polymer according to claim 15, wherein $R_4$ and $R_5$ independently are $C_1$ to $C_{25}$ aliphatic hydrocarbon having at least one substituent selected from the group consisting of hydrogen atom, hydroxyl, carboxylic anhydride and —COO($R_7$).

17. The photosensitive polymer according to claim 15, wherein $R_7$ is a t-butyl group.

18. The photosensitive polymer according to claim 15, wherein $R_7$ is an acid-labile alicyclic hydrocarbon group.

19. The photosensitive polymer according to claim 15, wherein $R_7$ is one of a 2-methyl-2-norbornyl group, a 2-ethyl-2-norbornyl group, a 2-methyl-2-isobornyl group, a 2-ethyl-2-isobornyl group, a 8-methyl-8-tricyclo[5.2.1.0$^{2.6}$]decanyl group, a 8-ethyl-8-tricyclo[5.2.1.0$^{2.6}$]decanyl group, a 2-methyl-2-adamantyl group, a 2-ethyl-2-adamantyl group, a 2-methyl-2-fenchyl group and a 2-ethyl-2-fenchyl group.

20. A resist composition comprising:

(a) a photosensitive polymer comprising a copolymer of alkyl vinyl ether and maleic anhydride, represented by the following structure:

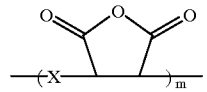

wherein X is a linear alkyl vinyl ether represented by the structure

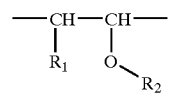

wherein $R_1$ is one of a hydrogen atom and a methyl group, and $R_2$ is a $C_1$ to $C_{20}$ hydrocarbon; and (b) a photoacid generator (PAG).

21. The resist composition according to claim 20, wherein $R_2$ is one of a methyl group, an ethyl group, a 2-hydroxy ethyl group, an n-butyl group and an iso-butyl group.

22. The resist composition according to claim 20, wherein the weight average molecular weight of the polymer is in the range of 3,000 to 100,000.

23. The resist composition according to claim 20, wherein the PAG is contained in an amount of 0.5 to 20% by weight based on the weight of the photosensitive polymer.

24. The resist composition according to claim 20, wherein the PAG is selected from the group consisting of triarylsulfonium salts, diaryliodonium salts, sulfonates or mixtures thereof.

25. The resist composition according to claim 24, wherein the PAG is selected from the group consisting of triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris (alkylslulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenysulfonium perfluorooctanesulfonate (PFOS), diphenyliodonium PFOS, methoxydiphenyliodonium PFOS, di-t-butyldiphenyliodonium triflate, N-hydroxysuccinimide PFOS, and norbornene-dicarboximide PFOS, or mixtures thereof.

26. The resist composition according to claim 20, further comprising an organic base.

27. The resist composition according to claim 26, wherein the organic base is contained in an amount of 0.5 to 50 mol % based on the concentration of the PAG.

28. The resist composition according to claim 26, wherein the organic base is a compound comprising tertiary amine alone or in a mixture of at least two kinds thereof.

29. The resist composition according to claim 28, wherein the organic base is triethylamine, triisobutylamine, trioctylamine, triisodecylamine, triethanolamine, N,N-dimethyl-1-naphthylamines, N-cyclohexyl pyrrolidinone, N-cyclopentyl pyrrolidinone, N-pentyl pyrrolidinone, N-hexyl pyrrolidinone, N-allyl caprolactam, N-ethyl caprolactam, N-butyl caprolactam, N-propyl caprolactam, N-butyl valerolactam, N-isobutyl valerolactam, and N-secondary butyl valerolactam, or a mixture thereof.

30. A resist composition comprising:
  (a) a photosensitive polymer; and
  (b) a photoacid generator (PAG), the photosensitive polymer comprising (a-1) a copolymer of alkyl vinyl ether and maleic anhydride and (a-2) a comonomer having an acid-labile substituent or a polar functional group, the copolymer being represented by the following structure:

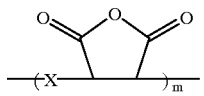

wherein X is a linear alkyl vinyl ether represented by the structure

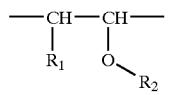

wherein $R_1$ is a hydrogen atom or a methyl group, and $R_2$ is a $C_1$ to $C_{20}$ hydrocarbon.

31. The resist composition according to claim 30, wherein $R_2$ is one of a methyl group, an ethyl group, a 2-hydroxy ethyl group, an n-butyl group and an iso-butyl group.

32. The resist composition according to claim 30, wherein the comonomer includes an acrylate derivative, a methacrylate derivative, a fumarate derivative, a styrene derivative or norbornene derivative.

33. The resist composition according to claim 30, wherein the comonomer has an alicyclic hydrocarbon group as the substituent.

34. The resist composition according to claim 30, wherein the PAG is contained in an amount of 0.5 to 20% by weight based on the weight of the photosensitive polymer.

35. The resist composition according to claim 30, wherein the PAG is selected from the group consisting of triarylsulfonium salts, diaryliodonium salts, sulfonates or mixtures thereof.

36. The resist composition according to claim 35, wherein the PAG is selected from the group consisting of triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris (alkylslulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenysulfonium perfluorooctanesulfonate (PFOS), diphenyliodonium PFOS, methoxydiphenyliodonium PFOS, di-t-butyldiphenyliodonium triflate, N-hydroxysuccinimide PFOS, and norbornene-dicarboximide PFOS, or mixtures thereof.

37. The resist composition according to claim 30, further comprising an organic base.

38. The resist composition according to claim 37, wherein the organic base is contained in an amount of 0.5 to 50 mol % based on the concentration of the PAG.

39. The resist composition according to claim 37, wherein the organic base is a compound comprising tertiary amine alone or in a mixture of at least two kinds thereof.

40. The resist composition according to claim 39, wherein the organic base is triethylamine, triisobutylamine, trioctylamine, triisodecylamine, triethanolamine, N,N-dimethyl-1-naphthylamines, N-cyclohexyl pyrrolidinone, N-cyclopentyl pyrrolidinone, N-pentyl pyrrolidinone, N-hexyl pyrrolidinone, N-allyl caprolactam, N-ethyl caprolactam, N-butyl caprolactam, N-propyl caprolactam, N-butyl valerolactam, N-isobutyl valerolactam, and N-secondary butyl valerolactam, or a mixture thereof.

* * * * *